(12) United States Patent
Lee et al.

(10) Patent No.: US 9,864,010 B2
(45) Date of Patent: Jan. 9, 2018

(54) INTERCONNECTION EVALUATION SYSTEM AND METHOD FOR SWITCHBOARD

(71) Applicant: LSIS CO., LTD., Anyang-si, Gyeonggi-do (KR)

(72) Inventors: Woo Seok Lee, Suwon-si (KR); Yong Gee Cho, Seoul (KR)

(73) Assignee: LSIS CO., LTD., Anyang-si (KR)

( * ) Notice: Subject to any disclaimer, the term of this patent is extended or adjusted under 35 U.S.C. 154(b) by 210 days.

(21) Appl. No.: 14/663,178

(22) Filed: Mar. 19, 2015

(65) Prior Publication Data

US 2015/0276878 A1    Oct. 1, 2015

(30) Foreign Application Priority Data

Mar. 31, 2014 (KR) .......................... 10-2014-0037845

(51) Int. Cl.
*G01R 31/04* (2006.01)
*G01R 31/327* (2006.01)
*G01R 31/02* (2006.01)
*G01R 31/28* (2006.01)
*H04M 5/06* (2006.01)
*H04M 3/28* (2006.01)

(52) U.S. Cl.
CPC ....... *G01R 31/3277* (2013.01); *G01R 31/024* (2013.01); *G01R 31/04* (2013.01); *G01R 31/2844* (2013.01); *H04M 3/28* (2013.01); *H04M 5/06* (2013.01)

(58) Field of Classification Search
CPC .................................. H04M 3/28; H04M 5/06
See application file for complete search history.

(56) References Cited

U.S. PATENT DOCUMENTS 5,574,653 A * 11/1996 Coomer .............. H02J 13/0086
361/115

FOREIGN PATENT DOCUMENTS

| CN | 1834664 | 9/2006 |
|---|---|---|
| CN | 101084447 | 12/2007 |
| CN | 102543609 | 7/2012 |
| EP | 0539298 | 4/1993 |

OTHER PUBLICATIONS

A. Jammes, Intelligent LV switchboards, Cahier technique No. 186, 1997.*
PLC-5/VME VME Bus Programmable Controllers, Allen-Bradley, 1995.*
The State Intellectual Property Office of the People's Republic of China Application No. 201510220676.6, Office Action dated Jun. 15, 2017, 6 pages.
Antoine Jammes, "Intelligent LV Switchboards," Schneider Cahier Technique Publication, Dec. 31, 1997, 32 pages.

* cited by examiner

*Primary Examiner* — Daniel Miller
(74) *Attorney, Agent, or Firm* — Lee, Hong, Degerman, Kang & Waimey

(57) ABSTRACT

An interconnection evaluation system according to the present disclosure includes a switchboard including at least one endpoint, at least one endpoint contact tester configured to transmit a digital input signal obtained from each endpoint, an automation tester configured to output a preset digital output signal to the switchboard, and to generate interconnection information at each endpoint by reflecting the digital output signal and digital input signal, and an interface unit configured to generate a switchboard status information of switchboard by reflecting the interconnection information.

8 Claims, 5 Drawing Sheets

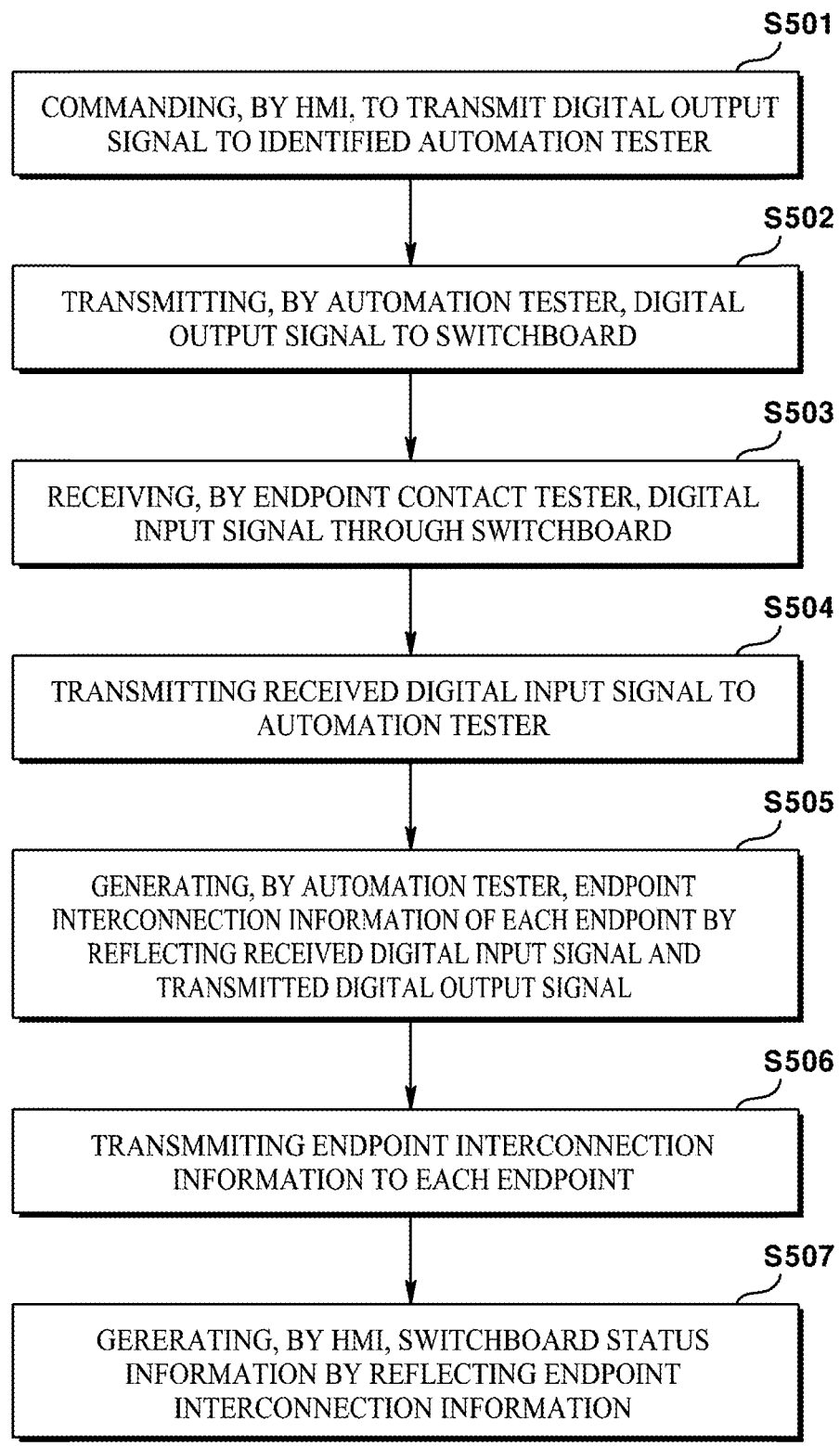

INTERCONNECTION EVALUATION SYSTEM AND METHOD FOR SWITCHBOARD

Pursuant to 35 U.S.C. §119 (a), this application claims the benefit of earlier filing date and right of priority to Korean Patent Application No. 10-2014-0037845, filed on Mar. 31, 2014, the contents of which are hereby incorporated by reference in their entirety.

BACKGROUND OF THE DISCLOSURE

Field of the Disclosure

The present disclosure relates to an interconnection evaluation system and a method for switchboard configured to automatically test an interconnection of a switch board.

Discussion of the Related Art

The information disclosed in this Discussion of the Related Art section is only for enhancement of understanding of the general background of the present disclosure and should not be taken as an acknowledgement or any form of suggestion that this information forms the prior art already known to a person skilled in the art.

A switchboard includes many wires and many contact distribution bridges, such that it is highly possible that the switchboard would suffer from drawbacks generated from human errors due to configuration through manual works. Methods to test an interconnection of a switchboard according to prior art are disadvantageously configured in a manner such that an input part of a switchboard and an output part corresponding to the input part are formed, and when a predetermined input value is inputted to the input part, an output value corresponding to the input value is checked one by one. Thus, when a switchboard is completed, completeness (integrity) of the switchboard is tested on contact test using a tester, and when there are many contacts, it takes lots of time and there is a low probability of finding problems at the time of contact tests.

SUMMARY OF THE DISCLOSURE

This section provides a general summary of the disclosure, and is not a comprehensive disclosure of its full scope or all of its features.

Exemplary aspects of the present disclosure are to substantially solve at least the above problems and/or disadvantages and to provide at least the advantages below. Accordingly, an aspect of the present disclosure is to provide an interconnection evaluation system and a method for switchboard configured to minimize human errors and other errors that may be generated in the course of testing matching (consistency) between accessories (parts) and interconnected parts.

It should be emphasized, however, that the present disclosure is not limited to a particular disclosure, as explained above. It should be understood that other technical subjects not mentioned herein may be appreciated by those skilled in the art.

In one general aspect of the present disclosure, there is provided an interconnection evaluation system, the system comprising:
a switchboard including at least one endpoints;
at least one endpoint contact tester configured to transmit a digital input signal obtained from each endpoint;
an automation tester configured to output a preset digital output signal to the switchboard, and to generate interconnection information at each endpoint by reflecting the digital output signal and digital input signal; and
an interface unit configured to generate a switchboard status information of switchboard by reflecting the interconnection information.

Preferably, but not necessarily, the endpoint contact tester may transmit the digital input signal to the automation tester after a rising time of the switchboard lapses when the automation tester outputs the digital output signal to the switchboard.

Preferably, but not necessarily, the automation tester may include storage, wherein the storage is stored with a matching (corresponding) relationship between the digital input signal and the digital output signal, and the interface unit generates switchboard status information by reflecting the interconnection information and the matching relationship.

Preferably, but not necessarily, the at least one endpoint contact tester may be integrated through a VME rack.

In another general aspect of the present disclosure, there is provided a method for switchboard interconnection evaluation system, the method comprising:
transmitting, by an automation tester, a digital output signal to a switchboard;
transmitting, by an endpoint contact tester, a digital input signal to the automation tester by receiving the digital input signal from the switchboard;
generating endpoint interconnection information formed on the switchboard by reflecting the digital input signal and the digital output signal received from the automation tester; and
generating switchboard status information of the switchboard by reflecting, by an interface unit, the endpoint interconnection information.

Preferably, but not necessarily, the step of transmitting, by the endpoint contact tester, the digital input signal to the automation tester by receiving the digital input signal from the switchboard may include transmitting includes transmitting the digital input signal to the automation tester after a preset time lapses when the automation tester transmits the digital output signal to the switchboard.

Preferably, but not necessarily, the step of generating endpoint interconnection information formed on the switchboard by reflecting the digital input signal and the digital output signal received from the automation tester may include generating the endpoint interconnection information based on a matching (corresponding) relationship between the digital output signal and the digital input signal.

Preferably, but not necessarily, the method may further comprise outputting, by the interface unit, the switchboard status information in response to a manipulation input of a user.

Advantageous Effects

The interconnection evaluation system and a method for switchboard according to an exemplary embodiment of the present disclosure has an advantageous effect in that test process of switchboard interconnection can be automated to allow a non-experienced person to easily perform a performance evaluation, a swift test can be made due to automation, reliability of test processes can be obtained due to improved reproducibility from automation, and probability of high human and property damages generated from interconnection test of switchboard can be minimized.

Other exemplary aspects, advantages, and salient features of the disclosure will become more apparent to persons of ordinary skill in the art from the following detailed description, which, taken in conjunction with the annexed drawings, discloses exemplary embodiments of the invention. The above and other features of the invention are discussed infra.

BRIEF DESCRIPTION OF THE DRAWINGS

The above and other features of the present disclosure will now be described in detail with reference to certain exemplary embodiments thereof illustrated in the accompanying drawings which are given hereinafter by way of illustration only, and thus are not limitative of the present invention, and wherein:

FIG. 5 is a flowchart illustrating a method for switchboard interconnection evaluation according to an exemplary embodiment of the present disclosure;

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

It is to be understood that both the foregoing general description and the following detailed description of the present disclosure are exemplary and explanatory and are intended to provide further explanation of the disclosure as claimed.

DETAILED DESCRIPTION

Hereinafter, exemplary embodiments of the present disclosure will be described in detail with reference to the accompanying drawings.

The terminology used herein is for the purpose of describing particular embodiments only and is not intended to be limiting of the disclosure. Accordingly, in some embodiments, well-known processes, well-known device structures and well-known techniques are not illustrated in detail to avoid unclear interpretation of the present disclosure. The same reference numbers will be used throughout the specification to refer to the same or like parts.

It will be understood that, although the terms first, second, A, B, (a), (b), etc. may be used herein to describe various elements, these elements should not be limited by these terms in terms of substances, sequences or orders. These terms are only used to distinguish one element from another. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Hereinafter, an interconnection evaluation system according to exemplary embodiments of the present disclosure will be described in detail with reference to FIGS. 1 to 4.

Figure 1:
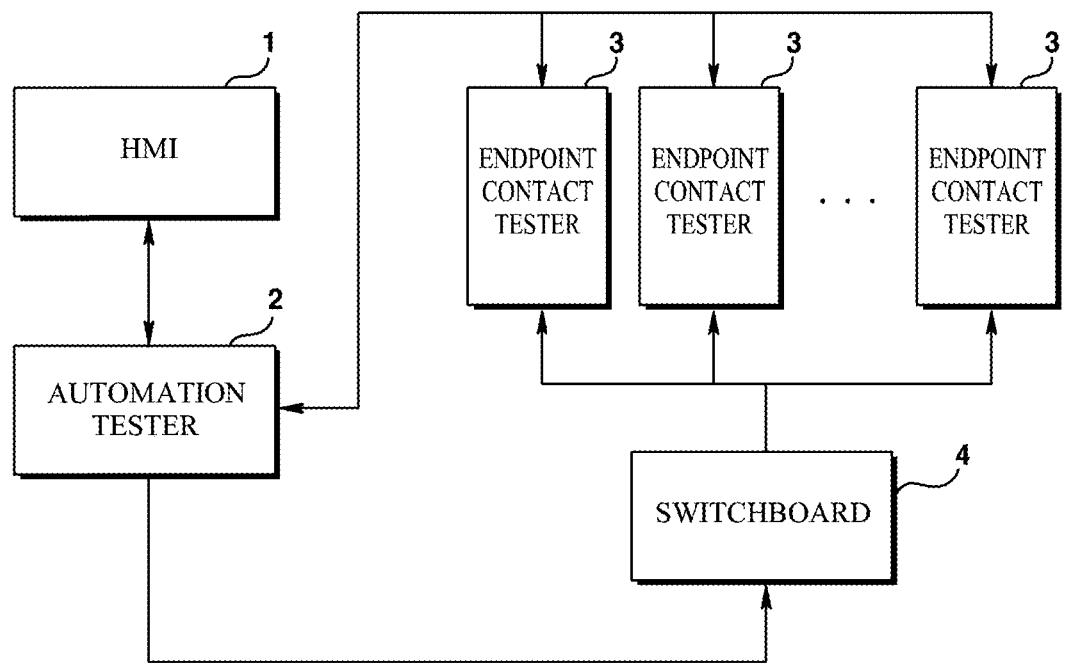
FIG. 1 is a schematic block diagram illustrating an interconnection evaluation system according to an exemplary embodiment of the present disclosure.

Referring to FIG. 1, an interconnection evaluation system according to exemplary embodiments of the present disclosure may largely include an interface unit (1, HMI, Human Machine Interface), an automation tester (2), a plurality of endpoint contact testers (3) and a switchboard (4).

The interface unit (1) may obtain a manipulation input from a user and display an output relative to the manipulation input. The automation tester (2) may transmit a digital output signal to the plurality of endpoint contact testers (3) through the switchboard (4). The plurality of endpoint testers (3) may receive the digital output signal outputted from the switchboard (4) and transmit information on a digital input signal to the automation contact tester (2). The plurality of endpoint contact testers may be integrated through a VME Rack.

Figure 2:
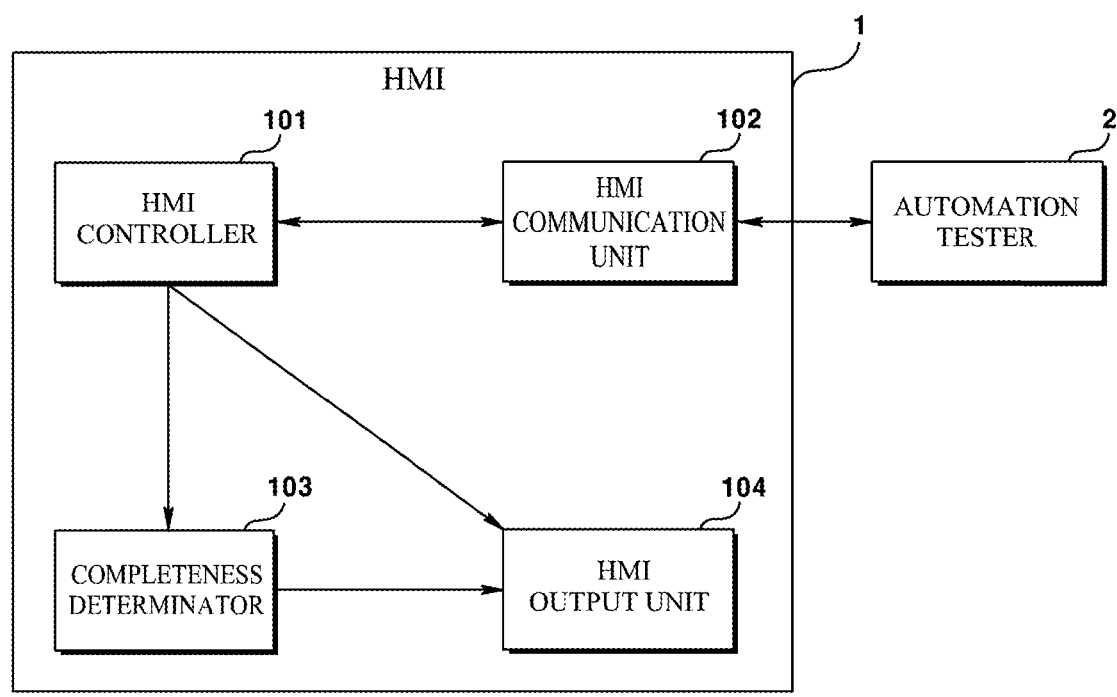
FIG. 2 is a schematic block diagram illustrating an interface unit according to an exemplary embodiment of the present disclosure.

Hereinafter, configuration and operation of the interface unit (1) will be described in detail with reference to FIG. 2.

The interface unit (1) may largely include an HMI controller (101), a completeness (integrity) determinator (103), an HMI communication unit (102), and an HMI output unit (104). The HMI controller (101) may control operations of storage (204, see FIG. 3), the completeness determinator (103), the HMI communication unit (102), and the HMI output unit (104).

The HMI communication unit (102) may perform a communication with at least one of the automation testers (2). The HMI communication unit (102) can distinguish the automation testers (2) by performing a communication with each of the automation testers (2). Furthermore, the HMI communication unit (102) may obtain endpoint interconnection information of each endpoint of the switch board (4) from the one or more automation testers (2) by performing a communication with the at least one of the automation testers (2).

The completeness determinator (103) may determine interconnection status of the switchboard (4) by reflecting interconnection information of each endpoint transmitted from the each automation tester (2), and generate switchboard status information included with information on the interconnection status of an entire switchboard (4) by reflecting the determined interconnection status of the switchboard (4). The HMI output unit (104) may output the generated switchboard status information.

Figure 3:
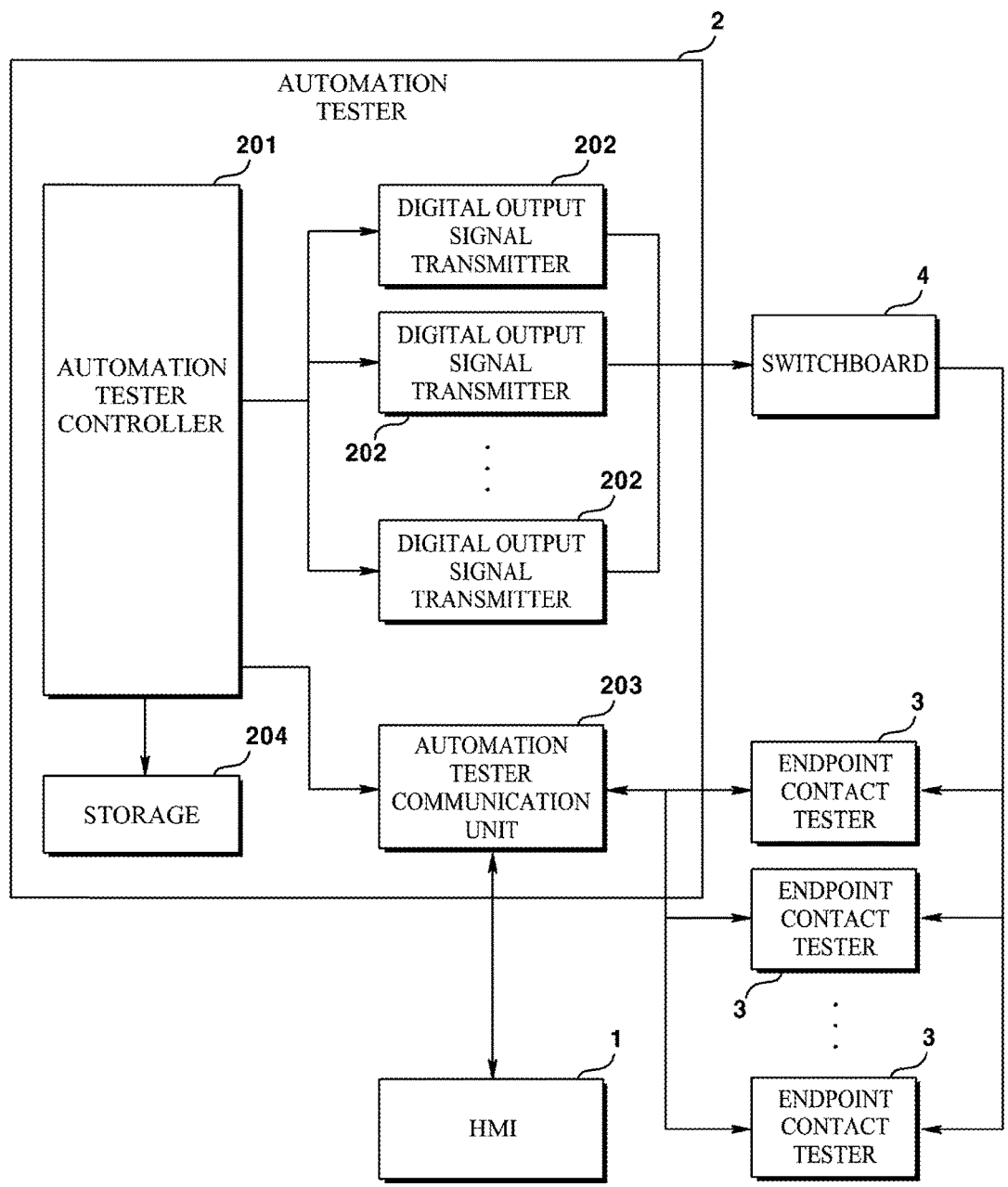
FIG. 3 is a schematic block diagram illustrating an automation tester according to an exemplary embodiment of the present disclosure.

Now, configuration and operation of the automation tester (2) will be described in detail with reference to FIG. 3.

The automation tester (2) may include storage (204), an automation tester controller (201), at least one digital output signal transmitter (202) and an automation tester communication unit (203).

The automation tester controller (201) may perform the controlling operation by an operation of transmitting a control signal to the digital output signal transmitter (202) inside the automation tester (2) and to the automation tester communication unit (203).

The automation tester controller (201) may determine if each digital input signal is inputted by digital input/output relationship information in response to each digital output signal by obtaining the digital input signal from the automation tester communication unit (203) and by reflecting the digital output signal based on the digital input signal, a digital output signal based on digital input/output relationship information obtained from the storage (204) and digital input/output relationship information, and generate endpoint interconnection information of each endpoint by reflecting a result from the determination.

The automation tester controller (201) may consolidate all endpoint interconnection information and transmit the consolidated information to the interface unit (1) through the automation tester communication unit (203). In communicating with the HMI communication unit (102), the automation tester communication unit (203) may communicate in a state where one HMI communication unit (102) is multiplexed with at least one automation tester communication unit (203). Furthermore, the automation tester communication unit (203) may communicate with the HMI communication unit (102) in Ethernet.

The automation tester communication unit (203) may receive an identity validation signal transmitted from the HMI communication unit (102) and transmit a response signal corresponding to the received identity validation signal. The automation tester communication unit (203) may receive from the HMI communication unit (102) a command to transmit endpoint interconnection information, and transmit to the HMI communication unit (102) the endpoint interconnection information in response to the command of the automation tester controller (201).

Furthermore, the automation tester communication unit (203) may communicate with the at least one endpoint contact tester (3) in a multiplexed state. The automation tester communication unit (203) may also communicate with each endpoint contact tester (3) using a CAN (Controller Area Network) method or an RS-485 method. The automation tester communication unit (203) may transmit a command to transmit a digital input signal received from each endpoint to each endpoint contact tester (3) when a first time lapses after transmission of a digital output signal from each digital output signal transmitter (202).

One example of the first time may include an RS (Rise Time), that is, a time in which an electrical state of the switchboard (4) becomes a steady state when a digital output signal is transmitted inside the switchboard after transmission of the digital output signal, where the steady state means an electrical steady state, and means a state in which power exchange of reactive elements inside a circuit reaches an equal value.

The automation tester communication unit (203) may obtain a digital input signal received from each endpoint contact tester at each endpoint. The storage (204) may store database of the digital output signal. Alternatively, the storage (204) may store a matching (corresponding) relationship between the digital output signal and the digital input signal, that is, digital input/output relationship information.

The digital input/output relationship information is information that contains contents defining a matching (corresponding) relationship between a digital output signal transmitted from the automation tester (2) and a digital input signal received by the endpoint contact tester (3). That is, the digital input/output relationship information is information that contains what value the digital input signal corresponding to the digital output signal has when the digital output signal normally reaches each endpoint of the switchboard through the switchboard. In conclusion, the digital input/output relationship information may be defined from a manufacturing process of a switchboard. Furthermore, the input/output relationship may be set up by a user.

The digital output signal transmitter (202) may transmit to the switchboard (4) a digital output signal defined from the storage (204) in response to a command from the automation tester controller (201). One of the digital output signal may be 0V, 5V or a Hi-Z (Hi-Zero) value, where Hi-Z value may mean a value where a voltage value of the digital output signal nears to O Voltage.

Figure 4:
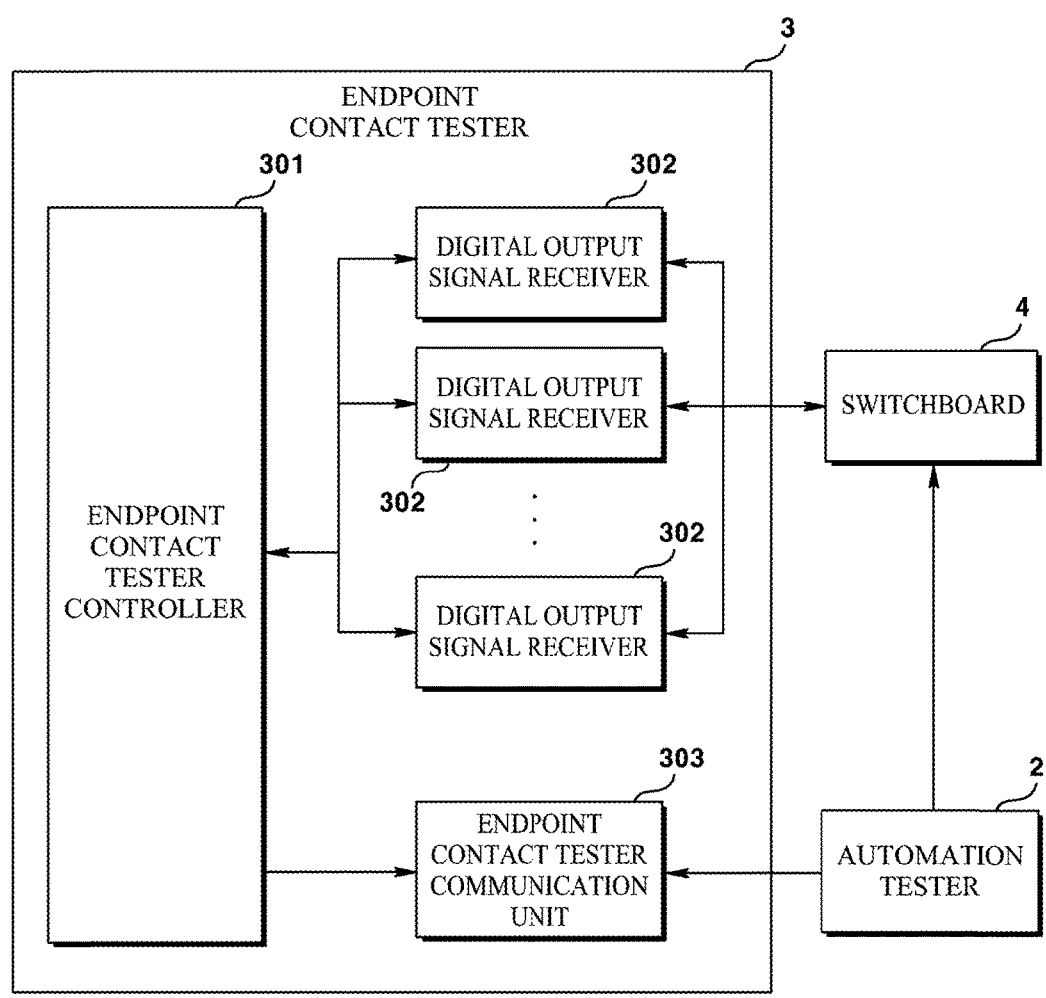
FIG. 4 is a schematic block diagram illustrating an endpoint contact tester according to an exemplary embodiment of the present disclosure.

Hereinafter, component elements of endpoint contact tester (3) and operations thereof will be described in detail with reference to FIG. 4.

The endpoint contact tester (3) may include an endpoint contact tester controller (301), at least one digital input signal receiver (302) and an endpoint contact tester communication unit (303).

The endpoint contact tester controller (301) may control the digital input signal receiver (302) and the endpoint contact tester communication unit (303). The digital input signal receiver (302) may receive a digital input signal from each endpoint and transmit the received digital input signal to the endpoint contact tester communication unit (303) through the endpoint contact tester controller (301).

The endpoint contact tester communication unit (303) may communicate in a multiplexed state by at least one endpoint contact tester communication unit (303) and one automation tester (2). One of the communication methods may be a CAN method or an RS-485 method.

When a command is received from the automation tester (2) to transmit a digital input signal, the endpoint contact tester communication unit (303) may receive a digital input signal of each endpoint from the digital input signal receiver (302) and transmit the received digital input signal to the automation tester (2).

Hereinafter, a method for switchboard interconnection evaluation according to an exemplary embodiment of the present disclosure will be described in detail with reference to FIG. 5.

First, the interface unit (1) may command an identified automation tester (2) to transmit a digital output signal to a switchboard (2) through communication with at least one automation tester (2) (S501). The communication method may use Ethernet as explained in the foregoing.

When the command to transmit a digital output signal is received from the interface unit (1), the identified automation tester (2) may transmit at least one digital output signal to the switchboard (4) (S502).

The endpoint contact tester (3) may receive a digital input signal from each endpoint of the switchboard (4) (S503), and transmit the digital input signal received from the automation tester (2) to the automation tester (2), when a command to transmit the digital input signal from the automation tester (2) is received (S504).

The automation tester (2) may generate endpoint interconnection information reflecting the transmitted digital input signal and the transmitted digital output signal (S505), when the digital input signal of each endpoint is received. The automation tester (2) may receive a digital input signal corresponding to one digital output signal whenever one digital output signal is transmitted, and determine whether the digital input signal received in response to the digital input/output relationship information is normally received. As a result of the determination, the automation tester (2) may generate endpoint interconnection information for each endpoint that shows whether interconnection at each endpoint is normally performed.

When the endpoint interconnection information is generated, the automation tester (2) may transmit the endpoint interconnection information of each endpoint to the interface unit (1) (S506). When the endpoint interconnection information of each endpoint is received from the automation tester (2), the interface unit (1) may generate switchboard status information by reflecting interconnection information of each endpoint (S507). When the interface unit (1) obtains the interconnection information of each endpoint, and receives the interconnection information of each end point from at least one automation tester (2), the interface unit (1) may consolidate the interconnection information of each endpoint, and generate switchboard status information included with information on the interconnection status of the entire switchboard.

The above-mentioned interconnection evaluation system and method for switchboard according to the present disclosure may, however, be embodied in many different forms and should not be construed as limited to the embodiments set forth herein. Thus, it is intended that embodiments of the present disclosure may cover the modifications and variations of this disclosure provided they come within the scope of the appended claims and their equivalents. While particular features or aspects may have been disclosed with respect to several embodiments, such features or aspects may be selectively combined with one or more other features and/or aspects of other embodiments as may be desired.

What is claimed is:

1. An interconnection evaluation system, the system comprising:
    a switchboard including at least one endpoint;
    at least one endpoint contact tester configured to transmit a digital input signal obtained from each endpoint of the switchboard;
    automation testers each configured to output a preset digital output signal to the switchboard, and to each generate interconnection information at each endpoint of the switchboard by reflecting the digital output signal and digital input signal; and
    an interface unit configured to generate a switchboard status information of the switchboard by reflecting the interconnection information,
    wherein the interface unit comprises:
    a HMI (Human Machine Interface) communication unit configured to perform a communication with the automation testers, and obtain endpoint interconnection information of each endpoint of the switchboard from the automation testers;
    a completeness determinator configured to determine interconnection status of the switchboard by reflecting the endpoint interconnection information of each endpoint transmitted from the automation testers, and generate switchboard status information including information on the interconnection status of the switchboard by reflecting the determined interconnection status of the switchboard; and
    a HMI output unit configured to output the generated switchboard status information, and
    wherein each of the automation testers includes an automation tester communication unit,
    wherein the automation tester communication units communicate with the at least one endpoint contact tester, and
    wherein the HMI communication unit communicates with the automation tester communication units in a multiplexed state.

2. The system of claim 1, wherein the at least one endpoint contact tester transmits the digital input signal to the automation testers after a rising time of the switchboard lapses when the automation tester outputs the digital output signal to the switchboard.

3. The system of claim 1, wherein the automation testers include storage, wherein the storage is stored with a matching (corresponding) relationship between the digital input signal and the digital output signal, and the interface unit generates the switchboard status information by reflecting the endpoint interconnection information and the matching relationship.

4. The system of claim 1, wherein the at least one endpoint contact tester is integrated through a VME rack.

5. A method for switchboard interconnection evaluation system, the method comprising:
    transmitting, by each of automation testers, a digital output signal to a switchboard;
    transmitting, by each of at least one endpoint contact tester, a digital input signal to the automation testers by receiving the digital input signal from the switchboard;
    generating endpoint interconnection information formed on the switchboard by reflecting the digital input signal and the digital output signal received from the automation testers;
    generating switchboard status information of the switchboard by reflecting, by an interface unit, the endpoint interconnection information;
    performing, by the interface unit, a communication with the automation testers;
    obtaining, by the interface unit, the endpoint interconnection information of each endpoint of the switchboard from the automation testers;
    determining interconnection status of the switchboard by reflecting the endpoint interconnection information of each endpoint of the switchboard transmitted from the automation testers;
    generating switchboard status information including information on the interconnection status of the switchboard by reflecting the determined interconnection status of the switchboard; and
    outputting the generated switchboard status information including the information on the interconnection status of the switchboard, and
    wherein each of the automation testers includes an automation tester communication unit,
    wherein the automation tester communication units communicate with the at least one endpoint contact tester, and
    wherein the HMI communication unit communicates with the automation tester communication units in a multiplexed state.

6. The method of claim 5, wherein the transmitting, by each of the at least one endpoint contact tester, the digital input signal to the automation testers by receiving the digital input signal from the switchboard includes transmitting the digital input signal to the automation tester after a preset time lapses when the automation testers transmit the digital output signal to the switchboard.

7. The method of claim 5, wherein the generating endpoint interconnection information formed on the switchboard by reflecting the digital input signal and the digital output signal received from the automation testers includes generating the endpoint interconnection information based on a matching (corresponding) relationship between the digital output signal and the digital input signal.

8. The method of claim 5, further comprising outputting, by the interface unit, the switchboard status information in response to a manipulation input of a user.

* * * * *